US012649537B2

(12) United States Patent
Zeng et al.

(10) Patent No.: US 12,649,537 B2
(45) Date of Patent: Jun. 9, 2026

(54) THERMAL MANAGEMENT SYSTEM AND THERMAL MANAGEMENT MODULE FOR ELECTRIC MOTORCYCLE, AND ELECTRIC MOTORCYCLE

(71) Applicant: HORWIN INC., Changzhou (CN)

(72) Inventors: Panhua Zeng, Changzhou (CN); Lei Zhang, Changzhou (CN); Yang Wang, Changzhou (CN)

(73) Assignee: HORWIN INC., Changzhou (CN)

( * ) Notice: Subject to any disclaimer, the term of this patent is extended or adjusted under 35 U.S.C. 154(b) by 246 days.

(21) Appl. No.: 18/576,371

(22) PCT Filed: Dec. 25, 2023

(86) PCT No.: PCT/CN2023/141377
§ 371 (c)(1),
(2) Date: Jan. 4, 2024

(87) PCT Pub. No.: WO2025/055199
PCT Pub. Date: Mar. 20, 2025

(65) Prior Publication Data
US 2025/0091678 A1 Mar. 20, 2025

(30) Foreign Application Priority Data
Sep. 15, 2023 (CN) .......................... 202311194759.3

(51) Int. Cl.
*B62J 41/00* (2020.01)
*B60L 58/24* (2019.01)
(Continued)

(52) U.S. Cl.
CPC .............. *B62J 41/00* (2020.02); *B60L 58/24* (2019.02); *B62K 11/00* (2013.01);
(Continued)

(58) Field of Classification Search
CPC ... B62J 41/00; B62J 11/16; B62J 11/19; B62J 43/16; B60L 58/24; B60L 2200/12;
(Continued)

(56) References Cited

U.S. PATENT DOCUMENTS 6,679,345 B2 1/2004 Hirayama et al.
10,056,769 B2 * 8/2018 Qu ........................ H01M 10/44
(Continued)

FOREIGN PATENT DOCUMENTS

CN 100374315 C 3/2008
JP WO-2023007971 A1 * 2/2023 ............. B60K 11/02
WO 2023007971 A1 2/2023

*Primary Examiner* — Tuan C To
*Assistant Examiner* — Dominick Mulder
(74) *Attorney, Agent, or Firm* — Bayramoglu Law Offices LLC

(57) ABSTRACT

A thermal management system for an electric motorcycle includes a base board, a motor thermal management loop, a battery thermal management loop, and an electrical line, where the motor thermal management loop includes a motor and a motor tube of the electric motorcycle; the motor tube is in fluid connection with the motor and includes a first fluid for cooling and/or heating the motor; the battery thermal management loop includes a battery and a battery tube of the electric motorcycle; the battery tube is in fluid connection with the battery and includes a second fluid for cooling and/or heating the battery; and the motor tube, the battery tube and the electrical line are located on the base board. A thermal management module for the electric motorcycle is further provided. The thermal management system and the thermal management module can realize integrated thermal management for the electric motorcycle.

26 Claims, 4 Drawing Sheets

(51) Int. Cl.

| | |
|---|---|
| *B62K 11/00* | (2006.01) |
| *H01M 10/613* | (2014.01) |
| *H01M 10/615* | (2014.01) |
| *H01M 10/625* | (2014.01) |
| *H01M 10/6554* | (2014.01) |
| *H01M 10/6568* | (2014.01) |
| *H02K 9/193* | (2006.01) |
| *H02K 11/25* | (2016.01) |
| *H10N 10/13* | (2023.01) |

(52) U.S. Cl.
CPC ....... *H01M 10/613* (2015.04); *H01M 10/615* (2015.04); *H01M 10/625* (2015.04); *H01M 10/6554* (2015.04); *H01M 10/6568* (2015.04); *H02K 9/193* (2013.01); *H02K 11/25* (2016.01); *H10N 10/13* (2023.02); *B60L 2200/12* (2013.01); *B60L 2240/425* (2013.01); *B60L 2240/545* (2013.01); *B62K 2204/00* (2013.01); *H01M 2220/20* (2013.01)

(58) Field of Classification Search
CPC ......... B60L 2240/425; B60L 2240/545; B60L 58/26; B60L 58/27; B62K 11/00; B62K 2204/00; H01M 10/613; H01M 10/615; H01M 10/625; H01M 10/6554; H01M 10/6568; H01M 2220/20; H01M 10/6567; H01M 10/663; H02K 9/193; H02K 11/25; H10N 10/13

USPC ........................................................... 701/22
See application file for complete search history.

(56) References Cited

U.S. PATENT DOCUMENTS

| | | | | |
|---|---|---|---|---|
| 10,211,493 | B2 * | 2/2019 | Janarthanam ....... | H01M 10/625 |
| 11,635,226 | B1 * | 4/2023 | Puga ........................ | F24F 11/81 |
| | | | | 165/58 |
| 2002/0162693 | A1 * | 11/2002 | Mizuno .............. | H01M 8/0612 |
| | | | | 180/65.1 |
| 2012/0312609 | A1 * | 12/2012 | Takewaka ................ | B62J 17/02 |
| | | | | 116/28 R |
| 2015/0217623 | A1 * | 8/2015 | Hatakeyama ........... | B60L 1/003 |
| | | | | 429/62 |
| 2015/0314830 | A1 * | 11/2015 | Inoue ....................... | B62J 43/16 |
| | | | | 180/220 |
| 2015/0329176 | A1 * | 11/2015 | Inoue .................. | H01M 50/249 |
| | | | | 180/220 |
| 2016/0226344 | A1 * | 8/2016 | Matsuda ................ | B62K 11/04 |
| 2019/0366799 | A1 * | 12/2019 | Czerwonka ........ | B60H 1/00428 |
| 2022/0041031 | A1 * | 2/2022 | Huang .................... | B60L 58/27 |
| 2022/0093983 | A1 * | 3/2022 | Li ........................ | H01M 10/425 |
| 2023/0011299 | A1 * | 1/2023 | Neligan ................. | B60L 53/14 |
| 2023/0099314 | A1 * | 3/2023 | Ido .......................... | B60L 50/20 |
| | | | | 180/206.2 |
| 2024/0123867 | A1 * | 4/2024 | Al-Zareer .............. | B60L 58/26 |
| 2024/0186928 | A1 * | 6/2024 | Huang .................... | H02P 21/22 |
| 2024/0255196 | A1 * | 8/2024 | Hu .......................... | F25B 13/00 |
| 2024/0324149 | A1 * | 9/2024 | Reitinger ................ | B60K 1/00 |

* cited by examiner

THERMAL MANAGEMENT SYSTEM AND THERMAL MANAGEMENT MODULE FOR ELECTRIC MOTORCYCLE, AND ELECTRIC MOTORCYCLE

CROSS REFERENCE TO THE RELATED APPLICATIONS

This application is the national phase entry of International Application No. PCT/CN2023/141377, filed on Dec. 25, 2023, which is based upon and claims priority to Chinese Patent Application No. 202311194759.3, filed on Sep. 15, 2023, the entire contents of which are incorporated herein by reference.

TECHNICAL FIELD

The present disclosure relates to the field of motorcycles, and in particular to a thermal management system and a thermal management module for an electric motorcycle, and the electric motorcycle.

BACKGROUND

This section is merely intended to provide background information related to the present disclosure, and does not necessarily constitute prior art.

With better performance configurations of motorcycles and particularly electric motorcycles, there are increasingly high requirements on thermal management of the motorcycles. In related art, components for thermal management are dispersed at different positions of the motorcycle. A fluid connection and an electrical connection between the components are realized through external tubes and external leads.

However, the thermal management system with dispersed arrangement may have the following problems. The dispersed components take up different spaces in the motorcycle, such that the intrinsically limited internal space of the motorcycle has a lower utilization rate. Since the tubes and the leads are required to be arranged between these components, the complexity of the arrangement and mounting in the motorcycle is increased, with a low integration level. In addition, while the fluid tube is lengthened, an internal flow resistance is increased, and a fluid pump capable of providing a higher power is required. On the other hand, due to a longer flow distance, a thermal management effect is undesirable, such that the whole system shows a low energy utilization rate, and the motorcycle shows a poor endurance.

SUMMARY

An objective of the present disclosure is to provide a thermal management system for an electric motorcycle, to at least partially solve the above problems. The objective of the present disclosure can be achieved by the following technical solutions:

A first aspect of the present disclosure provides a thermal management system for an electric motorcycle, including a base board, a motor thermal management loop, a battery thermal management loop, and an electrical line, where the motor thermal management loop includes a motor and a motor tube of the electric motorcycle; the motor tube is in fluid connection with the motor and includes a first fluid for cooling and/or heating the motor; the battery thermal management loop includes a battery and a battery tube of the electric motorcycle; the battery tube is in fluid connection with the battery and includes a second fluid for cooling and/or heating the battery; the electrical line is configured to electrically connect the motor, the battery, the motor thermal management loop and the battery thermal management loop; and the motor tube, the battery tube and the electrical line are located on the base board. By integrating the tube and the electrical line to the base board, the thermal management system provided by the present disclosure can realize integrated thermal management for the electric motorcycle. This at least makes the thermal management system mounted simply, and improves an internal space utilization rate of the electric motorcycle.

A second aspect of the present disclosure provides a thermal management module for an electric motorcycle, including a housing, a motor tube, a battery tube, and an electrical line, where the motor tube is in fluid connection with a motor of the electric motorcycle and includes a first fluid for cooling and/or heating the motor; the battery tube is in fluid connection with a battery of the electric motorcycle and includes a second fluid for cooling and/or heating the battery; the electrical line is configured to realize an electrical connection of the thermal management module; and the motor tube, the battery tube and the electrical line are located in the housing. By integrating the motor tube, the battery tube and the electrical line in the housing of the module, the thermal management module provided by the present disclosure can realize integrated thermal management for the electric motorcycle. In addition, the thermal management module can be directly inserted into the battery and/or the motor of the motorcycle, such that the fluid tube or the electrical line between the thermal management module and the battery and/or the motor is omitted. This not only can simplify mounting and reduce a flow resistance of the fluid, but also can improve an internal space utilization rate and a thermal management effect of the motorcycle.

A third aspect of the present disclosure provides an electric motorcycle, including the thermal management system and/or the thermal management module, where the electric motorcycle is an electrically-driven motorcycle, or is referred to as an all-electric motorcycle. The electric motorcycle can be provided with the integrated thermal management system or the integrated thermal management module. This not only can simplify a mounting process of the motorcycle and reduce a mounting difficulty of the motorcycle, but also can improve an internal space utilization rate and a thermal management effect of the motorcycle.

BRIEF DESCRIPTION OF THE DRAWINGS

By reading the detailed description of the following preferred implementations, various other advantages and benefits will become apparent to those of ordinary skill in the art. The accompanying drawings are provided merely to illustrate the preferred implementations, rather than to limit the present disclosure. Throughout the accompanying drawings, the same reference numerals represent the same components. In the accompanying drawings.

DETAILED DESCRIPTION OF THE EMBODIMENTS

Figure 1:
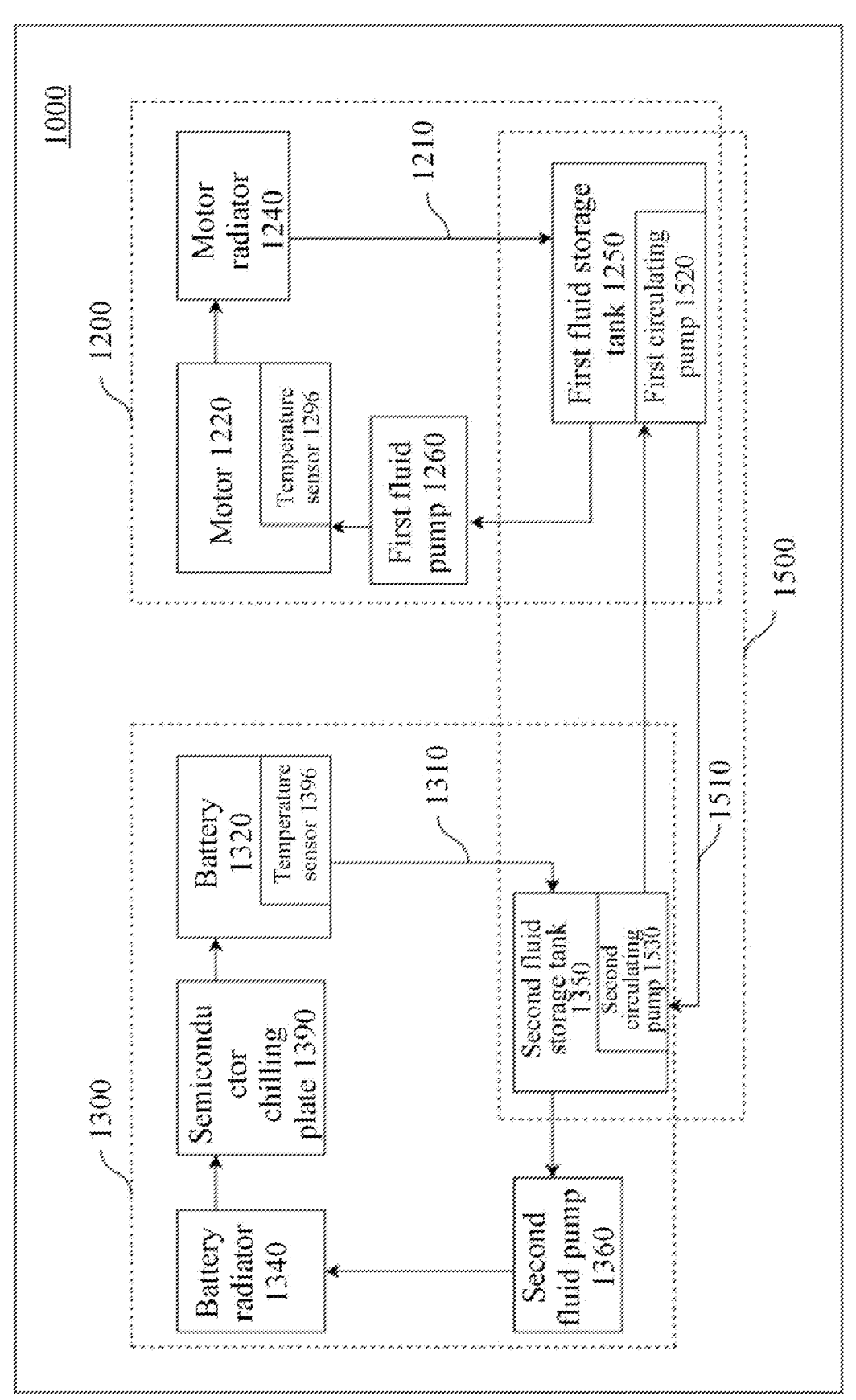
FIG. 1 is a schematic view of a thermal management system for an electric motorcycle according to an implementation of the present disclosure.

Exemplary implementations of the present disclosure will be described below in more detail with reference to the accompanying drawings. Although the accompanying drawings show exemplary implementations of the present disclosure, it should be understood that the present disclosure may be implemented in various forms and should not be limited to the implementations set forth herein. On the contrary, these implementations are provided so that the present disclosure will be more fully understandable, and will fully convey the scope of the present disclosure to those skilled in the art.

It is to be understood that the terms used in the description of the present disclosure are for the purpose of describing specific exemplary implementations only and are not the limit to the present disclosure. As used herein, the singular forms such as "a", "an" and "the" are intended to include the plural forms as well, unless the context clearly indicates otherwise. The terms "include", "comprising" and "having" are inclusive, and specify the presence of stated features, elements, and/or components, but do not preclude the presence or addition of one or more other features, elements, components, and/or combinations thereof.

Although the terms such as first and second may be used herein to describe various elements, components, regions, layers and/or sections, these elements, components, regions, layers and/or sections should not be limited by these terms. These terms are only used to distinguish one element, component, region, layer or section from another region, layer or section. Unless the context clearly indicates otherwise, terms such as "first", "second" and "third" and other numerical terms do not imply a sequence or an order in use. In addition, in the description of the present disclosure, unless otherwise clearly specified and limited, the meanings of terms "mounting" and "connection" should be understood in a broad sense. For example, the connection may be a fixed connection, a removable connection or an integrated connection, may be a direct connection or an indirect connection via an intermediate medium, and may also be a fluid connection, an electrical connection or mechanical connection. In the description of the present disclosure, unless otherwise clearly specified and limited, terms such as "fixed" indicate that a plurality of components are coupled or fixed according to technical requirements, to realize mechanical assembly without affecting correct relative positions and a correct mutual relationship, such as a mechanical connection between a bolt and a threaded hole. The term "electrical interface" is not limited to an electrical connection piece, and may be any coupling device connected to an electrical terminal to form a circuit. Those skilled in the art may understand specific meanings of the foregoing terms in the present disclosure based on a specific situation.

Spatially relative terms, such as "upper", "middle", "lower", "inner" and "close", may be used herein for ease of description to describe one element or feature's relationship to another element or feature as illustrated in the figures. The spatially relative terms are intended to encompass different orientations of the device in use or operation in addition to the orientation depicted in the figures. For example, if the device in the figures is turned over, elements described as "below" or "beneath" other elements or features would then be oriented "on" the other elements or features or "above" the other elements or features. Thus, the exemplary term "below" can encompass both an orientation of above and below. The device may be otherwise oriented (rotated 90 degrees or at other orientations) and the spatially relative descriptors used herein shall be interpreted accordingly.

In a related art, a fuel motorcycle usually only includes an engine cooling system. In contrast, an electric motorcycle is required to meet more complex thermal management of a motor and a battery. If the cooling system of the fuel motorcycle is applied to the electric motorcycle, the following problems may arise. The engine cooling loop is structurally complex, so the engine cooling system for cooling the motor or the battery is prone to unnecessary redundancy in structure. On the other hand, since the engine of the fuel motorcycle only has an overheated working state, only a cooling function is considered in thermal management. For the electric motorcycle, a thermal management system with a cooling function and a heating function is desired. For example, in some cases (such as in winter or in a low-temperature state), it is further possible to heat the battery and/or the motor, such that the battery works at an appropriate temperature (in a range from 0° C. to 40° C.) and/or the motor works at an appropriate temperature (in a range from −20° C. to 85° C.).

In the related art, a thermal management system of an electric car includes a motor cooling system, a battery thermal management system, and an air conditioning system (such as a cockpit air conditioning system). If the thermal management system of the electric car is applied the electric motorcycle, there may be the following problems. Because of no air conditioning system in the electric motorcycle, direct omission of the air conditioning system will damage a coupling relationship among the three systems. Moreover, the thermal management system of the electric car hardly meets a special working condition of the electric motorcycle. On the other hand, since a frame of the car is far greater than a frame of the motorcycle, components, tubes and lines in the two frames vary a lot. Compared with the car in which an enough space is provided for the thermal management system, the thermal management system of the electric motorcycle not only omits an active air cooling module (such as the air conditioning system), but also desires a higher space utilization rate, and realizes a thermal management effect on the battery and the motor in the relatively limited space of the motorcycle.

In view of this, different from the fuel motorcycle and the electric car, the thermal management design of the electric motorcycle is required to meet a special working condition and a special thermal management requirement of the electric motorcycle. In the present disclosure, the thermal management system or the thermal management module for the electric motorcycle uses integrated thermal management. In a preferred implementation, except the battery and the motor, all other components in the thermal management system can be integrated to a base board to form the thermal management module. All tubes and leads can be integrated in the thermal management module, the battery and the motor. Through direct insertion of a fluid interface and an electrical interface, the thermal management module can be connected to the battery and/or the motor, thereby completing assembly of the thermal management system. In this way, the thermal management system or the thermal management module is highly integrated, such that an internal space of the electric motorcycle can be fully utilized and a mounting complexity of the electric motorcycle can be reduced.

Embodiments of the present disclosure are described below with reference to various exemplary drawings.

FIG. 1 illustrates thermal management system 1000 for an electric motorcycle according to an implementation of the present disclosure. The electric motorcycle may be an all-electric motorcycle, and may also be a hybrid motorcycle driven by an electricity and a fuel. The thermal management system 1000 may include base board 1100, motor thermal management loop 1200, battery thermal management loop 1300, and an electrical line.

The motor thermal management loop 1200 may be formed by motor tube 1210 and motor 1220 through a fluid connection, and may be provided therein with first fluid 1230 for cooling and/or heating the motor. Likewise, the battery thermal management loop 1300 may be formed by battery tube 1310 and battery 1320 through a fluid connection, and may be provided therein with second fluid 1330 for cooling and/or heating the battery. It is to be understood that the tube may be any connection piece capable of realizing fluid transportation, such as a hose or a hard tube for connecting each component, and is preferably a rubber tube, a nylon tube, a plastic tube, a metal tube or other tubular pieces for realizing the above function. It is to be understood that the fluid may be any substance capable of realizing heat exchange, such as gas, water, ethanol, glycerol, ethylene glycol and a combination thereof or other substances for realizing the above function. Preferably, the first fluid and the second fluid may be a same fluid medium or different fluid media (such as a coolant), and at least one of the first fluid and the second fluid may be a fluid medium simultaneously having a cooling function and a heating function.

The electrical line is configured to realize an electrical connection of the thermal management system 1000, for example, realize an electrical connection of the base board 1100, the motor thermal management loop 1200, the battery thermal management loop 1300 and other components of the thermal management system. In other words, the electrical line may be configured to realize an electrical connection of a whole or part of the thermal management system or the thermal management module. Within a scope of the present disclosure, the electrical line may be any electrical component capable of realizing an electrical connection or transmitting a current between electrical devices, such as a lead, a printed circuit board (PCB) or other electrical components for realizing the above function.

It is advantageous that the motor tube 1210, the battery tube 1310 and the electrical line are integrated to the base board 1100 of the thermal management system. The base board may be any bearing component to which the electrical line and the fluid tube can be integrated. In the thermal management system 1000, all tubes or electrical lines for the fluid connection or the electrical connection are either provided on the base board or in the housing, or provided in the motor or the battery. Outside these components (the base board or the housing, the motor and the battery) or between these components, any fluid tube or electrical line is not allowed. Therefore, the thermal management system or the thermal management module provided by the present disclosure does not need to individually mount the tube or the electrical line. This can lower a mounting difficulty and a complexity of the electric motorcycle.

In addition, the motor thermal management loop 1200 may further include motor radiator 1240, first fluid storage tank 1250, and first fluid pump 1260. It is advantageous that these components can also be provided on the base board 1100 (such as through a bolted connection), and are in fluid connection through the motor tube 1210. Likewise, the battery thermal management loop 1300 may further include battery radiator 1340, second fluid storage tank 1350, and second fluid pump 1360. It is advantageous that these components can also be provided on the base board 1100 (such as through a bolted connection), and are in fluid connection through the battery tube 1310.

In a preferred implementation, the battery thermal management loop 1300 may further include semiconductor chilling plate 1390. The semiconductor chilling plate may be provided on the base board 1100 through a bolted connection, and may be electrically connected through the electrical line. Preferably, in response to a forward current, the semiconductor chilling plate may be used for heating, such as indirectly heating the battery through the second fluid and/or directly heating the battery. In response to a reverse current, the semiconductor chilling plate may be used for cooling, such as indirectly cooling the battery through the second fluid and/or directly heating the battery. Preferably, an on or off state and a current direction of the semiconductor chilling plate may be controlled by a controller.

Within the scope of the present disclosure, the radiator may be any device that uses a heat conduction material and a heat transfer medium, and transfers heat from a heat source to an environment through a surface, such as an aluminum alloy heat sink, a copper heat sink or other devices for realizing the above function. It is to be understood that the battery radiator 1340 and the motor radiator 1240 can be detachably provided on the base board through a threaded connection, a keyed connection and a riveted connection, and can also be non-detachably provided on the base board through a welded connection. Within the scope of the present disclosure, the fluid storage tank may be any open or sealed tank capable of storing the fluid. Within the scope of the present disclosure, the fluid pump may be any conveying device capable of conveying the fluid or pressurizing the fluid through an electrical energy, a mechanical energy, and the like, and is preferably an electronic pump. Preferably, an on or off state and a flow rate of each of the first fluid pump and the second fluid pump may be controlled by the controller, so as to meet different thermal management requirements. In addition, all fluid connections in the base board can be sealed by a rubber seal ring and the like.

In a preferred implementation, as shown in FIG. 1, the thermal management system may further include circulation loop 1500 connected between the motor thermal management loop 1200 and the battery thermal management loop 1300. The circulation loop 1500 may be configured to control whether different thermal management loops communicate for fluid exchange. For example, in response to a low temperature of the battery, heat dissipated by the motor may be used to heat the battery (or vice versa) through the fluid exchange. This can reduce energy consumption of the system.

The circulation loop 1500 may further include first circulating pump 1520 in the first fluid storage tank 1250, second circulating pump 1530 in the second fluid storage tank 1350, and circulation tube 1510. Herein, the circulation tube 1510 is in fluid connection with the first circulating pump 1520 and the second fluid storage tank 1350, and in fluid connection with the second circulating pump 1530 and the first fluid storage tank 1250. Preferably, the circulation loop may at least have an off state and an on state. In response to the off state of the circulation loop, the first fluid storage tank 1250 and the second fluid storage tank 1350 are separated apart, and the first fluid and the second fluid are not circulated to each other (namely the first fluid and the second fluid circularly flow in respective loops, and the fluid in one loop does not flow to the other loop). Hence, the motor thermal management loop and the battery thermal management loop can be independent of each other in operation. In response to the on state of the circulation loop, the first fluid storage tank 1250 and the second fluid storage tank 1350 communicate with each other through the circulation tube, such that the first fluid and the second fluid are circulated to each other (namely the first fluid and the second fluid can flow from one loop to the other loop). At least one of the first circulating pump 1520 and the second circulating pump 1530 provides a hydrodynamic force, such that the motor thermal management loop and the battery thermal management loop communicate with each other and exchange heat.

The thermal management system 1000 may further include a controller. The controller is configured to control the on or off state or the flow rate of each of the first circulating pump and the second circulating pump, thereby controlling whether the first fluid and the second fluid in the motor thermal management loop and the battery thermal management loop are circulated to each other, and controlling a circulating amount. Specifically, temperature sensors 1296 and 1396 may be used to respectively detect a temperature of the battery and a temperature of the motor timely or untimely. When detecting that the temperature of the battery is less than a preset battery low-temperature threshold (for example, in a range from −10° C. to 10° C., preferably in a range from −5° C. to 5° C., and more preferably 0° C.), and the temperature of the motor is greater than the temperature of the battery (for example, in winter or at a low environmental temperature of the motorcycle), the controller can send a control signal, such that the first circulating pump and the second circulating pump are turned on, thereby turning on the circulation loop, and realizing heat exchange between the battery thermal management loop and the motor thermal management loop. In this way, the heat of the motor can be used for heating the battery. This makes full use of the heat of the motor, and prevents an operation fault of the battery at a low temperature. It can be conceivable that the heat of the battery can also be used for heating the motor in a similar way if necessary. The controller may further be configured to control the on or off state and the current direction of the semiconductor chilling plate 1390. For example, when the temperature of the battery is less than the preset battery low-temperature threshold, the controller sends a control signal, such that the semiconductor chilling plate is turned on, with a forward current. The semiconductor chilling plate can heat the fluid in the battery tube so as to indirectly heat the battery, or can directly heat the battery. When the temperature of the battery is greater than a preset battery high-temperature threshold (for example, in a range from 35° C. to 55° C., preferably in a range from 40° C. to 45° C., and more preferably 40° C.), the controller can send a control signal, such that the current in the semiconductor chilling plate is reversed. Hence, the semiconductor chilling plate can cool the fluid in the battery tube so as to indirectly cool the battery, or can directly cool the battery. When the temperature of the battery is greater than the preset battery low-temperature threshold and less than the preset battery high-temperature threshold, the controller sends a control signal to turn off the semiconductor chilling plate.

Figure 2:
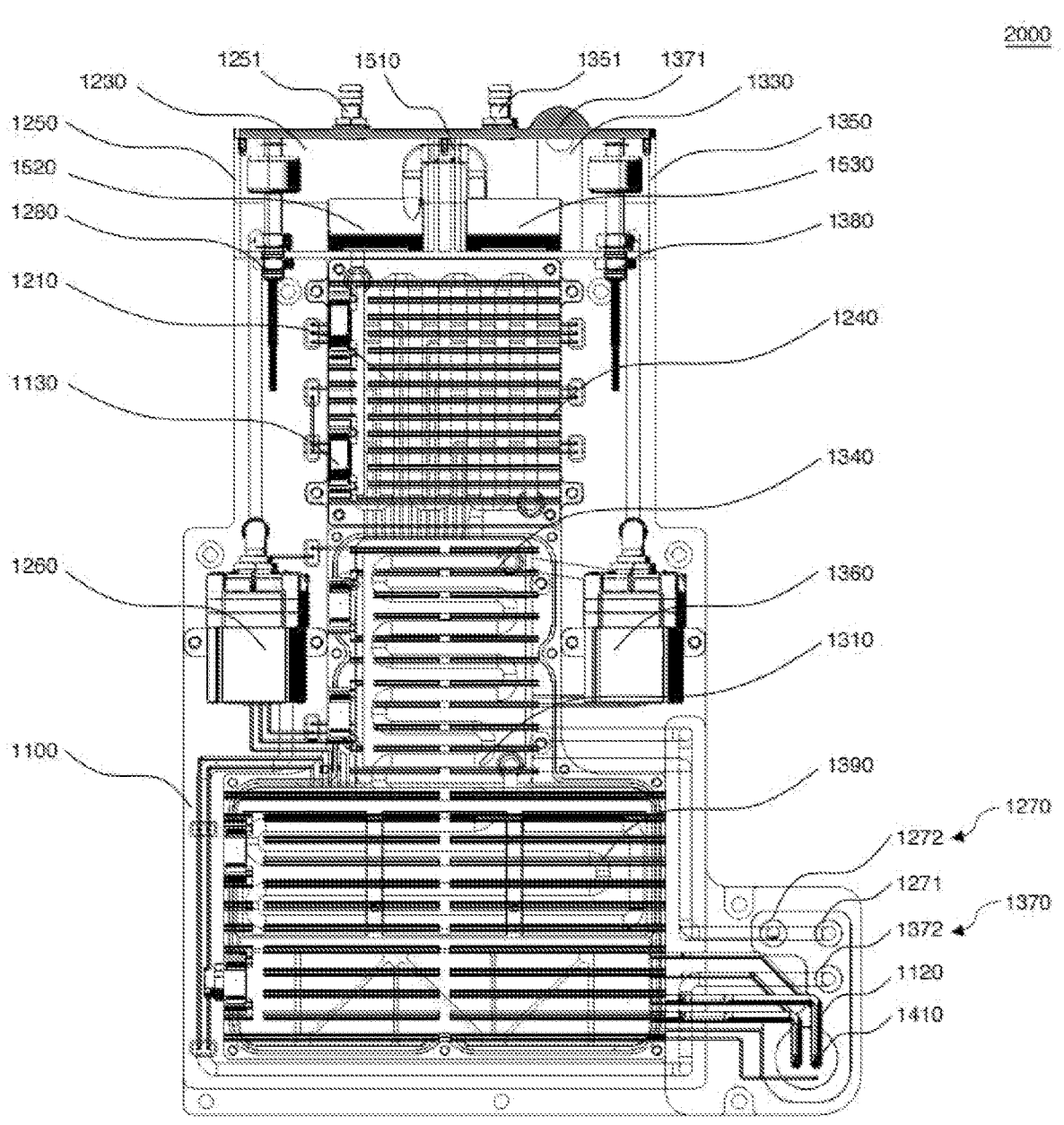
FIG. 2 is a schematic view of a thermal management module for an electric motorcycle according to an implementation of the present disclosure.

FIG. 2 exemplarily illustrates a thermal management module according to an implementation of the present disclosure. It is to be understood that the thermal management module 2000 can constitute one part of the thermal management system 1000, and include for example a remaining part except the battery and the motor. Therefore, the solution on the thermal management system (such as FIG. 1) can also be adaptively applied to the thermal management module, and vice versa. Contents described above in detail are not repeated herein.

As shown in FIG. 2, the thermal management module 2000 may include a housing, motor tube 1210, battery tube 1310, and an electrical line. The first fluid 1230 and the second fluid 1330 are respectively circulated in the motor tube 1210 and the battery tube 1310. Within the scope of the present disclosure, the housing can be understood as any alternative or additional bearing component on the base board 1100. Therefore, the components integrated to the base board 1100 can also be provided in the housing alternatively or additionally to similarly or further improve an integration level of the module.

Herein, the first fluid storage tank 1250 and the second fluid storage tank 1350 respectively provide an enough storage space for the first fluid and an enough storage space for the second fluid. Preferably, the first fluid storage tank 1250 and the second fluid storage tank 1350 are arranged in an upper region of the thermal management module. An upper side of the first fluid storage tank and an upper side of the second fluid storage tank are respectively provided with storage tank filling port 1251 for filling the first fluid and storage tank filling port 1351 for filling the second fluid. The storage tank filling ports at an uppermost side of the thermal management module are opened conveniently, without contacting other components. Optionally, the first fluid storage tank 1250 and the second fluid storage tank 1350 may be formed into two independent tanks. In order to fully utilize a space in the motorcycle, the two tanks can be the same or similar in size and shape, and can be arranged in parallel at the upper region of the thermal management module. Alternatively, the first fluid storage tank 1250 and the second fluid storage tank 1350 may also be formed into one tank. A clapboard is provided in a middle of the tank to separate the tank into two regions, thereby forming the first fluid storage tank 1250 and the second fluid storage tank 1350.

Herein, the first fluid pump 1260 and the second fluid pump 1360 may be configured to provide a power for the fluid, such that the first fluid 1230 and the second fluid 1330 respectively flow in the motor thermal management loop 1200 and the battery thermal management loop 1300, thereby realizing a thermal management effect. Preferably, the first fluid pump 1260 and the second fluid pump 1360 may be an electronic pump. The electronic pump may include an electrical plug and a pump fluid interface. For ease of mounting, the electrical plug and the pump fluid interface are preferably located at a same side of the electronic pump. Accordingly, an electrical socket, a fluid inlet and a fluid outlet may be provided on the base board and corresponding to the electronic pump. The electrical plug of the electronic pump and the electrical plug on the base board are inserted into each other to realize an electrical connection of the electronic pump. The pump fluid interface of the electronic pump and the fluid inlet or the fluid outlet on the base board are inserted into each other to realize a fluid connection. In addition, the electronic pump may further be provided on the base board through for example a detachable structure between a bolt and a threaded hole. In order to better seal the fluid, a sealing element such as a rubber sealing ring may further be provided at the pump fluid interface.

Herein, the motor tube 1210 may be in fluid connection with other components in the motor thermal management loop 1200 according to a transverse and/or longitudinal shortest path from the first fluid inlet 1271. This can reduce a flow resistance and lower a power requirement of the fluid pump. At the motor radiator 1240, the motor tube 1210 may be S-shaped, such that the first fluid in the motor tube fully exchanges heat with the motor radiator. The first fluid finally flows to the first fluid outlet 1272 along the motor tube, thereby leaving away from the thermal management module and flowing to a fluid tube directly inserted with the thermal management module and provided in the motor or the battery.

Herein, the battery tube 1310 may be in fluid connection with other components in the battery thermal management loop 1300 according to a transverse and/or longitudinal shortest path from the second fluid inlet 1371. This can reduce a flow resistance and lower a power requirement of the fluid pump. At the battery radiator 1300, the battery tube 1310 may be S-shaped, such that the second fluid in the battery tube fully exchanges heat with the battery radiator. The second fluid finally flows to the second fluid outlet 1372 along the battery tube 1310, thereby leaving away from the thermal management module and flowing to a fluid tube directly inserted with the thermal management module and provided in the motor or the battery.

In a preferred implementation, at the semiconductor chilling plate 1390, the battery tube 1310 may be S-shaped, such that the second fluid in the battery tube can fully exchange heat with the semiconductor chilling plate. The semiconductor chilling plate may be provided in a lower half region (such as a bottom region) of the base board, and may at least partially overlap with the battery tube 1310. It is to be understood that the position of the semiconductor chilling plate on the base board is not limited, and can be adjusted correspondingly according to the position of the battery or the battery tube, provided that the semiconductor chilling plate can partially overlay the battery tube and/or the battery and preferably does not overlay any motor tube.

Figure 3:
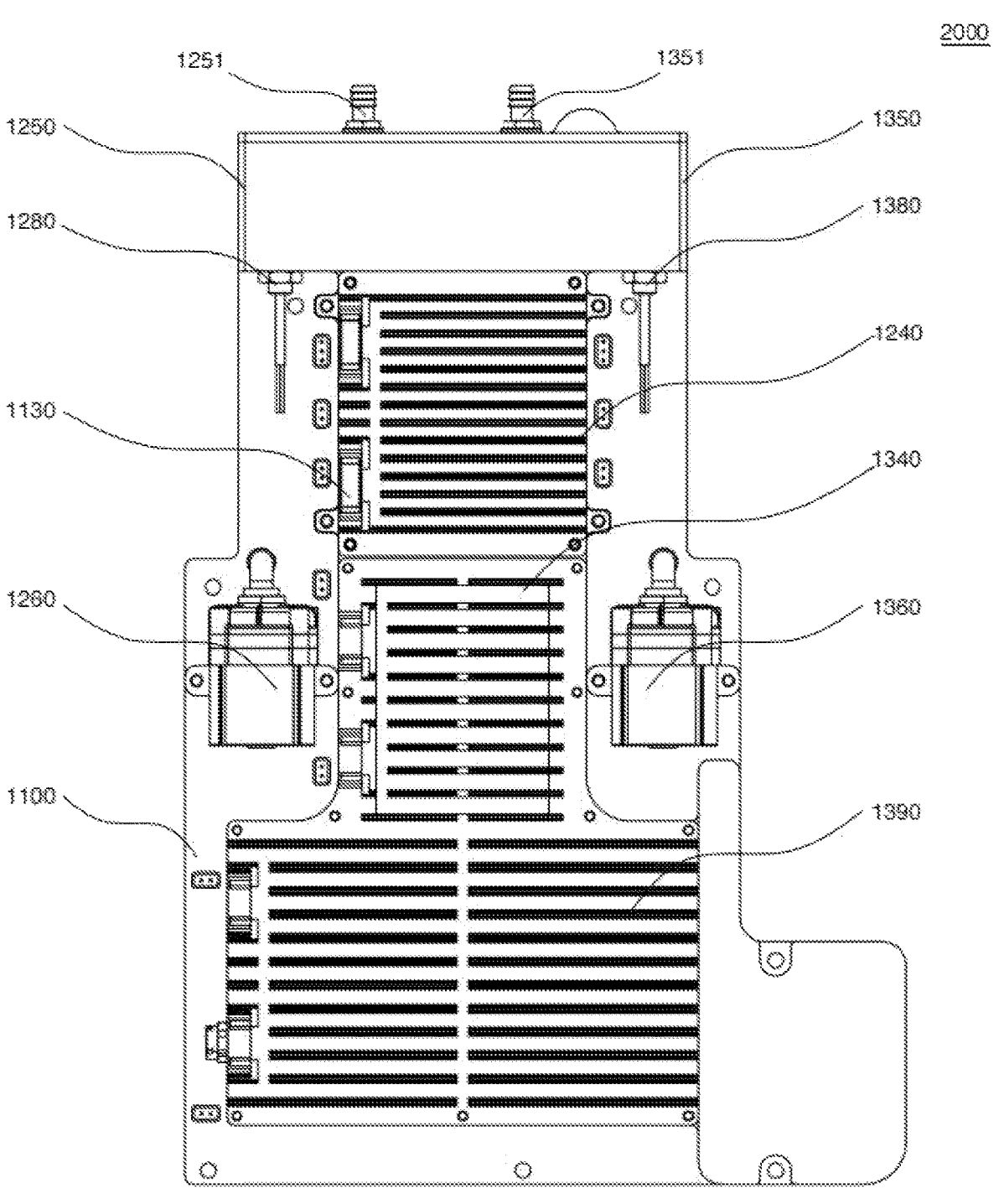
FIG. 3 is another schematic view of a thermal management module for an electric motorcycle according to an implementation of the present disclosure.

FIG. 3 illustrates an exemplary arrangement of the thermal management module 2000. In the example, the first fluid storage tank 1250 and the second fluid storage tank 1350 are arranged in parallel at a top region of the thermal management module, the first fluid pump 1260 and the second fluid pump 1360 are respectively provided at two side regions of the thermal management module, and the motor radiator 1240 and the battery radiator 1340 are sequentially provided at a middle region of the base board from top to bottom. In this way, routes in fluid connections and electrical connections between the components are short as much as possible to reduce a flow resistance and an electrical wiring complexity.

Preferably, liquid level sensors 1280 and 1380 may be respectively provided in the first fluid storage tank 1250 and the second fluid storage tank 1350. The liquid level sensors 1280 and 1380 may be electrically connected through the electrical line, and configured to timely or untimely detect a fluid stored amount in the first fluid storage tank 1250 and the second fluid storage tank 1350. When detecting that a liquid level in the liquid storage tank is less than a preset liquid level threshold, the liquid level sensor reminds a user of adding the fluid. This can timely prevent abnormal operation of the thermal management system and/or the thermal management module due to the insufficient fluid.

In addition, the thermal management module 2000 may further include fan 1130. For example, there are six to eight fans. These fans 1130 are electrically connected through the electrical line, and are preferably laterally arranged at one side of the motor radiator and/or the battery radiator, such that airflows from the fans can cool a surface of the radiator.

The laterally provided fans further prevent impurities such as splashed sludge from attaching to the fans in driving of the motorcycle. It is to be understood that the fans may be provided at any side of the motor radiator or the battery radiator, and may also be provided at one side of the motor radiator and at one side of the battery radiator at the same time. In addition, a number of the fans and positions of the fans may be flexibly adjusted according to an actual need. Preferably, the fans may also be controlled by the controller according to a use requirement. For example, when the temperature of the battery is greater than the preset battery high-temperature threshold (for example, in a range from 35° C. to 55° C., preferably in a range from 40° C. to 45° C., and more preferably 40° C.), or the temperature of the motor is greater than a preset motor high-temperature threshold (for example, in a range from 55° C. to 100° C., preferably in a range from 75° C. to 95° C., and more preferably 85° C.), the controller can send a control signal to start the fan. Herein, it is to be understood that the control signal of the fan is unnecessarily limited to the temperature of the battery or the temperature of the motor. For example, the fan at one side of the battery radiator can operate when the temperature of the battery is greater than the preset high-temperature threshold, and the fan at one side of the motor radiator can operator when the temperature of the motor is greater than the preset high-temperature threshold.

Figure 4:
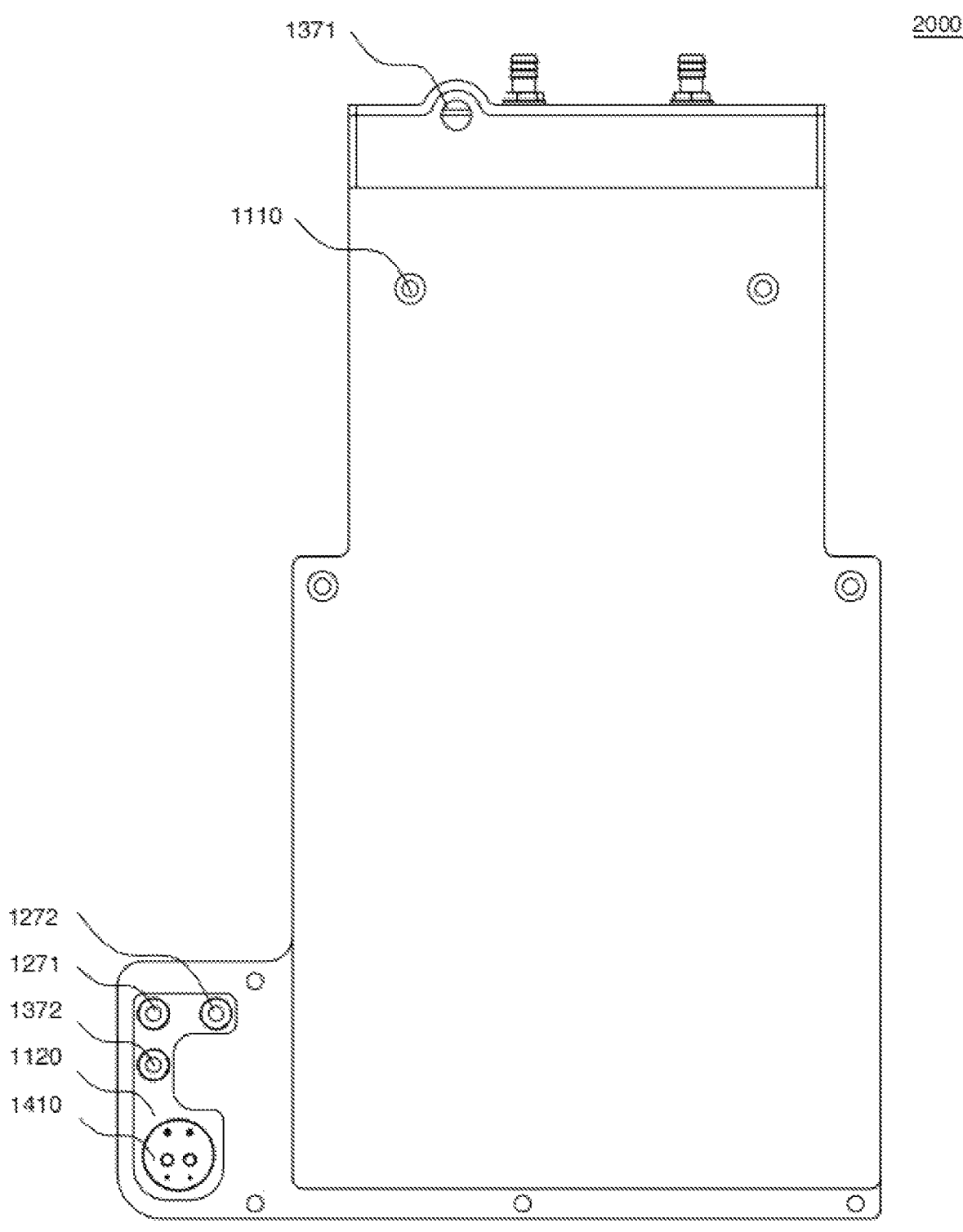
FIG. 4 is another schematic view of a thermal management module for an electric motorcycle according to an implementation of the present disclosure.

FIG. 4 exemplarily illustrates a fluid interface and an electrical interface of the thermal management module 2000. As described above, the thermal management module 2000 includes a first fluid interface, a second fluid interface, and an electrical interface. The first fluid interface may include a first fluid inlet and a first fluid outlet. The second fluid interface may include a second fluid inlet and a second fluid outlet. In a preferred implementation, all or at least one of the first fluid inlet, the first fluid outlet, the second fluid inlet, the second fluid outlet and the electrical interface 1410 may be formed in one connector interface. By connecting the connector interface, the fluid connection and the electrical connection of the thermal management module can be realized at the same time, or the fluid connection of the battery thermal management loop and the fluid connection of the motor thermal management loop can be realized at the same time.

Preferably, the first fluid inlet 1271, the first fluid outlet 1272, the second fluid outlet 1372 and the electrical interface 1410 may be collectively formed in one connector interface 1120, while the second fluid inlet 1371 may be formed outside the connector interface 1120.

In the connector interface 1120, the first fluid inlet 1271 and the first fluid outlet 1272 are parallel formed in an upper portion of the connector interface, the second fluid outlet is formed in a middle portion of the connector interface, and the electrical interface is formed in a lower portion of the connector interface. It is to be understood that the first fluid inlet 1271, the first fluid outlet 1272, the second fluid outlet 1372 and the electrical interface 1410 in the thermal management module are not limited to the above arrangement, and a number of interfaces in the connector interface 1120 and an arrangement of the interfaces can be adjusted according to a requirement of the tube and the electrical line or the corresponding interface on the battery or the motor.

Herein, the first fluid interface 1270 can be directly inserted into the fluid interface of the battery 1320 and/or the motor 1220, such that the fluid connection between the motor tube and the tube in the motor and/or the battery is realized, without other fluid tubes therebetween. The first fluid 1230 may flow to the motor tube 1210 through the first fluid inlet 1271 from the motor 1220, flow to other components in the motor thermal management loop 1200, and flow out from the motor tube 1210 to the motor 1220 through the first fluid outlet 1272, thereby realizing circular flowing of the first fluid between the motor 1220 and the thermal management module to cool or heat the motor 1220.

Likewise, the second fluid interface 1370 can be directly inserted into the fluid interface of the battery 1320 and/or the motor 1220, such that the fluid connection between the battery tube and the tube in the motor and/or the battery is realized, without other fluid tubes therebetween. The second fluid 1330 may flow to the battery tube 1310 through the second fluid inlet 1371 from the battery 1320, flow to other components in the battery thermal management loop 1300, and flow out from the battery tube 1310 to the battery 1320 through the second fluid outlet 1372, thereby realizing circular flowing of the second fluid between the battery 1320 and the base board 1100 to cool or heat the battery 1320.

Likewise, the electrical interface 1410 can be directly inserted into the electrical interface of the battery 1320 and/or the motor 1220, such that the electrical connection between the thermal management module and the motor and/or the battery is realized, without other electrical lines therebetween. The base board 1100 is fixed with the battery 1320 and/or the motor 1220 through mounting hole 1110.

The present disclosure realizes integrated thermal management for the electric motorcycle through the following various implementations. By integrating the fluid tube and the electrical tube to the thermal management module, and directly inserting the thermal management module into the battery or the motor, the present disclosure can at least make the thermal management system mounted simply, and improves an internal space utilization rate and a thermal management effect of the electric motorcycle.

Item 1. A thermal management system for an electric motorcycle includes: a base board; a motor thermal management loop, where the motor thermal management loop includes a motor and a motor tube of the electric motorcycle, and the motor tube is in fluid connection with the motor and includes a first fluid for cooling and/or heating the motor; a battery thermal management loop, where the battery thermal management loop includes a battery and a battery tube of the electric motorcycle, and the battery tube is in fluid connection with the battery and includes a second fluid for cooling and/or heating the battery; and an electrical line configured to realize an electrical connection of the thermal management system, where the motor tube, the battery tube and the electrical line are located on the base board.

Item 2. The thermal management system according to item 1, where the thermal management system does not include a tube or an electrical line located outside the base board, the motor and the battery.

Item 3. The thermal management system according to item 1, where the motor thermal management loop further includes a motor radiator, a first fluid storage tank, and a first fluid pump that are connected through the motor tube; and the battery thermal management loop further includes a battery radiator, a second fluid storage tank, and a second fluid pump that are connected through the battery tube.

Item 4. The thermal management system according to item 3, where the first fluid storage tank and the second fluid storage tank are arranged in parallel at a top region of the base board, the first fluid pump and the second fluid pump are respectively provided at two side regions of the base board, and the motor radiator and the battery radiator are respectively provided at a middle region of the base board.

Item 5. The thermal management system according to item 3, where liquid level sensors for detecting a stored amount of the first fluid and a stored amount of the second fluid are respectively provided in the first fluid storage tank and the second fluid storage tank.

Item 6. The thermal management system according to item 1, where the thermal management system further includes: a first fluid interface, where the motor tube is directly connected to the battery and/or the motor through the first fluid interface in an insertion manner; a second fluid interface, where the battery tube is directly connected to the battery and/or the motor through the second fluid interface in the insertion manner; and an electrical interface configured to allow the thermal management system to be directly connected to the battery and/or the motor in the insertion manner, where the first fluid interface, the second fluid interface and the electrical interface are located on the base board.

Item 7. The thermal management system according to item 6, where the first fluid interface includes a first fluid inlet and a first fluid outlet respectively configured to allow the first fluid to flow into the thermal management system and flow out of the thermal management system; and the second fluid interface includes a second fluid inlet and a second fluid outlet respectively configured to allow the second fluid to flow into the thermal management system and flow out of the thermal management system.

Item 8. The thermal management system according to item 7, where at least one of the first fluid interface, the second fluid interface and the electrical interface is formed in one connector interface.

Item 9. The thermal management system according to item 8, where the first fluid inlet, the first fluid outlet, the second fluid outlet and the electrical interface are formed in one connector interface.

Item 10. The thermal management system according to items 1 to 9, where the thermal management system further includes a circulation loop, and the circulation loop is connected between the motor thermal management loop and the battery thermal management loop; and the circulation loop includes an off state and an on state.

Item 11. The thermal management system according to item 10, where in response to the off state of the circulation loop, the motor thermal management loop and the battery thermal management loop are independent of each other, such that the first fluid and the second fluid are not circulated to each other; and/or in response to the on state of the circulation loop, the motor thermal management loop and the battery thermal management loop are in fluid communication.

Item 12. The thermal management system according to item 10, where the circulation loop further includes a first circulating pump located in the first fluid storage tank, a second circulating pump located in the second fluid storage tank, and a circulation tube for connecting the first circulating pump and the second circulating pump.

Item 13. The thermal management system according to item 12, where the thermal management system further includes a semiconductor chilling plate provided on the base board and configured to cool and/or heat the battery.

Item 14. The thermal management system according to item 13, where the thermal management system further includes a fan, and the fan is laterally provided at a side of the motor radiator and/or the battery radiator.

Item 15. The thermal management system according to item 14, where the thermal management system further includes a controller, and the controller is configured to: turn on or off the first fluid pump, the second fluid pump, the first circulating pump and/or the second circulating pump; control a flow rate passing through the first fluid pump, the second fluid pump, the first circulating pump and/or the second circulating pump; control a magnitude and/or a direction of a current passing through the semiconductor chilling plate; and/or control operation of the fan.

Item 16. The thermal management system according to item 15, where the controller is configured to: when a temperature of the battery is less than a battery low-temperature threshold, and a temperature of the motor is greater than the temperature of the battery, turn on the first circulating pump and the second circulating pump, such that the circulation loop is in the on state.

Item 17. The thermal management system according to item 15, where the controller is configured to: when a temperature of the battery is less than a battery low-temperature threshold, control the semiconductor chilling plate to conduct a forward current for heating; and/or when the temperature of the battery is greater than a battery high-temperature threshold, control the semiconductor chilling plate to conduct a reverse current for cooling.

Item 18. The thermal management system according to item 15, where the controller is configured to: turn on the fan when a temperature of the motor is greater than a motor high-temperature threshold, and/or a temperature of the battery is greater than a battery high-temperature threshold.

Item 19. The thermal management system according to any one of items 16 to 18, where the battery low-temperature threshold falls within a range from −10° C. to 10° C., and the battery high-temperature threshold falls within a range from 35° C. to 55° C.

Item 20. The thermal management system according to any one of items 1 to 9, where the first fluid and the second fluid are a same coolant.

Item 21. A thermal management module for an electric motorcycle, including: a housing; a motor tube, where the motor tube is in fluid connection with a motor of the electric motorcycle and including a first fluid for cooling and/or heating the motor; a battery tube, where the battery tube is in fluid connection with a battery of the electric motorcycle and including a second fluid for cooling and/or heating the battery; and an electrical line configured to realize an electrical connection of the thermal management module, where the motor tube, the battery tube and the electrical line are located in the housing.

Item 22. The thermal management module according to item 21, where the thermal management module further includes: a motor radiator, a first fluid storage tank, and a first fluid pump that are located in the housing and connected through the motor tube; and a battery radiator, a second fluid storage tank, and a second fluid pump that are located in the housing and connected through the battery tube.

Item 23. The thermal management module according to item 22, where the first fluid storage tank and the second fluid storage tank are arranged in parallel at a top region of the thermal management module, the first fluid pump and the second fluid pump are respectively provided at two side regions of the thermal management module, and the motor radiator and the battery radiator are respectively provided at a middle region of the thermal management module.

Item 24. The thermal management module according to item 21, where the thermal management module further includes: a first fluid interface, where the motor tube is directly connected to the battery and/or the motor through the first fluid interface in an insertion manner; a second fluid interface, wherein the battery tube is directly connected to the battery and/or the motor through the second fluid interface in the insertion manner; and an electrical interface configured to allow the thermal management module to be directly connected to the battery and/or the motor in the insertion manner, where the first fluid interface, the second fluid interface and the electrical interface are located on the housing.

Item 25. The thermal management module according to any one of items 22 to 24, where the thermal management module further includes a circulation loop, and the circulation loop is connected between a motor thermal management loop and a battery thermal management loop; the circulation loop includes an off state and an on state; and preferably, the circulation loop includes a first circulating pump located in the first fluid storage tank, a second circulating pump located in the second fluid storage tank, and a circulation tube for connecting the first circulating pump and the second circulating pump.

Item 26. The thermal management module according to item 25, where the thermal management module further includes a semiconductor chilling plate provided in the housing and configured to cool and/or heat the battery.

Item 27. The thermal management module according to item 26, where the thermal management module further includes a controller, and the controller is configured to: turn on or off the first fluid pump, the second fluid pump, the first circulating pump and/or the second circulating pump; control a flow rate passing through the first fluid pump, the second fluid pump, the first circulating pump and/or the second circulating pump; and control a magnitude and/or a direction of a current passing through the semiconductor chilling plate.

Item 28. The thermal management module according to item 27, where the controller is configured to: when a temperature of the battery is less than a battery low-temperature threshold, and a temperature of the motor is greater than the temperature of the battery, turn on the first circulating pump and the second circulating pump, such that the circulation loop is in an on state.

Item 29. An electric motorcycle, including the thermal management system according to any one of items 1 to 20 and/or the thermal management module according to any one of items 21 to 28.

Item 30. The electric motorcycle according to item 29, where the electric motorcycle is an all-electric motorcycle.

The above merely describes preferred specific implementations of the present disclosure, but the protection scope of the present disclosure is not limited thereto. Any person skilled in the art can easily conceive modifications or replacements within the technical scope of the present disclosure, and these modifications or replacements shall fall within the protection scope of the present disclosure. Therefore, the protection scope of the present disclosure shall be subject to the protection scope of the claims.

What is claimed is:

1. A thermal management system for an electric motorcycle, comprising:
   a base board;
   a motor thermal management loop, wherein the motor thermal management loop comprises a motor and a motor tube of the electric motorcycle, and the motor tube is in fluid connection with the motor and comprises a first fluid for cooling and/or heating the motor;
   a battery thermal management loop, wherein the battery thermal management loop comprises a battery and a battery tube of the electric motorcycle, and the battery tube is in fluid connection with the battery and comprises a second fluid for cooling and/or heating the battery; and an electrical line configured to realize an electrical connection of the thermal management system;

wherein the motor tube, the battery tube and the electrical line are located on the base board, the thermal management system further comprising a circulation loop, wherein the circulation loop is connected between the motor thermal management loop and the battery thermal management loop; and the circulation loop comprises an off state and an on state, wherein in response to the off state of the circulation loop, the motor thermal management loop and the battery thermal management loop are independent of each other, such that the first fluid and the second fluid are not circulated to each other; and/or in response to the on state of the circulation loop, the motor thermal management loop and the battery thermal management loop are in fluid communication.

2. The thermal management system according to claim 1, wherein the thermal management system does not comprises a tube or an electrical line located outside the base board, the motor and the battery.

3. The thermal management system according to claim 1, wherein the motor thermal management loop further comprises a motor radiator, a first fluid storage tank, and a first fluid pump, wherein the motor radiator, the first fluid storage tank, and the first fluid pump are connected through the motor tube; and the battery thermal management loop further comprises a battery radiator, a second fluid storage tank, and a second fluid pump, wherein the battery radiator, the second fluid storage tank, and the second fluid pump are connected through the battery tube.

4. The thermal management system according to claim 3, wherein the first fluid storage tank and the second fluid storage tank are arranged in parallel at a top region of the base board, the first fluid pump and the second fluid pump are respectively provided at two side regions of the base board, and the motor radiator and the battery radiator are respectively provided at a middle region of the base board.

5. The thermal management system according to claim 3, wherein a first liquid level sensor for detecting a stored amount of the first fluid is provided in the first fluid storage tank, and a second liquid level sensor for detecting a stored amount of the second fluid is provided in the second fluid storage tank.

6. The thermal management system according to claim 1, further comprising:

a first fluid interface, wherein the motor tube is directly connected to the battery and/or the motor through the first fluid interface in an insertion manner;

a second fluid interface, wherein the battery tube is directly connected to the battery and/or the motor through the second fluid interface in the insertion manner; and an electrical interface configured to allow the thermal management system to be directly connected to the battery and/or the motor in the insertion manner;

wherein the first fluid interface, the second fluid interface and the electrical interface are located on the base board.

7. The thermal management system according to claim 6, wherein the first fluid interface comprises a first fluid inlet and a first fluid outlet, wherein the first fluid inlet is configured to allow the first fluid to flow into the thermal management system, and the first fluid outlet is configured to allow the first fluid to flow out of the thermal management system; and the second fluid interface comprises a second fluid inlet and a second fluid outlet, wherein the second fluid inlet is configured to allow the second fluid to flow into the thermal management system, and the second fluid outlet is configured to allow the second fluid to flow out of the thermal management system.

8. The thermal management system according to claim 7, wherein at least one of the first fluid interface, the second fluid interface and the electrical interface is formed in one connector interface.

9. The thermal management system according to claim 8, wherein the first fluid inlet, the first fluid outlet, the second fluid outlet and the electrical interface are formed in one connector interface.

10. The thermal management system according to claim 3, wherein the circulation loop further comprises a first circulating pump located in the first fluid storage tank, a second circulating pump located in the second fluid storage tank, and a circulation tube for connecting the first circulating pump and the second circulating pump.

11. The thermal management system according to claim 10, further comprising a semiconductor chilling plate, wherein the semiconductor chilling plate is provided on the base board and configured to cool and/or heat the battery.

12. The thermal management system according to claim 11, further comprising a fan, wherein the fan is laterally provided at a side of the motor radiator and/or the battery radiator.

13. The thermal management system according to claim 12, further comprising a controller, wherein the controller is configured to:

turn on or off the first fluid pump, the second fluid pump, the first circulating pump and/or the second circulating pump;

control a flow rate passing through the first fluid pump, the second fluid pump, the first circulating pump and/or the second circulating pump;

control a magnitude and/or a direction of a current passing through the semiconductor chilling plate; and/or control operation of the fan.

14. The thermal management system according to claim 13, wherein the controller is further configured to:

when a temperature of the battery is less than a battery low-temperature threshold, and a temperature of the motor is greater than the temperature of the battery, turn on the first circulating pump and the second circulating pump, such that the circulation loop is in the on state.

15. The thermal management system according to claim 13, wherein the controller is further configured to:

when a temperature of the battery is less than a battery low-temperature threshold, control the semiconductor chilling plate to conduct a forward current for heating; and/or when the temperature of the battery is greater than a battery high-temperature threshold, control the semiconductor chilling plate to conduct a reverse current for cooling.

16. The thermal management system according to claim 13, wherein the controller is further configured to:

turn on the fan when a temperature of the motor is greater than a motor high-temperature threshold, and/or a temperature of the battery is greater than a battery high-temperature threshold.

17. The thermal management system according to claim 14, wherein the battery low-temperature threshold falls within a range from −10° C. to 10° C., and the battery high-temperature threshold falls within a range from 35° C. to 55° C.

18. The thermal management system according to claim 1, wherein the first fluid and the second fluid are a same coolant.

19. A thermal management module for an electric motorcycle, comprising:

a housing;

a motor tube, wherein the motor tube is in fluid connection with a motor of the electric motorcycle and comprising a first fluid for cooling and/or heating the motor;

a battery tube, wherein the battery tube is in fluid connection with a battery of the electric motorcycle and comprising a second fluid for cooling and/or heating the battery; and an electrical line configured to realize an electrical connection of the thermal management module;

wherein the motor tube, the battery tube and the electrical line are located in the housing, wherein the thermal management module further comprises a motor radiator, a first fluid storage tank, and a first fluid pump, wherein the motor radiator, the first fluid storage tank, and the first fluid pump are located in the housing and connected through the motor tube, a battery radiator, a second fluid storage tank, and a second fluid pump, wherein the battery radiator, the second fluid storage tank, and the second fluid pump are located in the housing and connected through the battery tube, a circulation loop, wherein the circulation loop is connected between a motor thermal management loop and a battery thermal management loop; and the circulation loop comprises a first circulating pump located in the first fluid storage tank, a second circulating pump located in the second fluid storage tank, and a circulation tube for connecting the first circulating pump and the second circulating pump.

20. The thermal management module according to claim 19, wherein the first fluid storage tank and the second fluid storage tank are arranged in parallel at a top region of the thermal management module, the first fluid pump and the second fluid pump are respectively provided at two side regions of the thermal management module, and the motor radiator and the battery radiator are respectively provided at a middle region of the thermal management module.

21. The thermal management module according to claim 19, comprising:

a first fluid interface, wherein the motor tube is directly connected to the battery and/or the motor through the first fluid interface in an insertion manner;

a second fluid interface, wherein the battery tube is directly connected to the battery and/or the motor through the second fluid interface in the insertion manner; and an electrical interface configured to allow the thermal management module to be directly connected to the battery and/or the motor in the insertion manner;

wherein the first fluid interface, the second fluid interface and the electrical interface are located on the housing.

22. The thermal management module according to claim 19, further comprising a semiconductor chilling plate, wherein the semiconductor chilling plate is provided in the housing and configured to cool and/or heat the battery.

23. The thermal management module according to claim 22, further comprising a controller, wherein the controller is configured to:

turn on or off the first fluid pump, the second fluid pump, the first circulating pump and/or the second circulating pump;

control a flow rate passing through the first fluid pump, the second fluid pump, the first circulating pump and/or the second circulating pump; and control a magnitude and/or a direction of a current passing through the semiconductor chilling plate.

24. The thermal management module according to claim 23, wherein the controller is further configured to:

when a temperature of the battery is less than a battery low-temperature threshold, and a temperature of the motor is greater than the temperature of the battery, turn on the first circulating pump and the second circulating pump, such that the circulation loop is in an on state.

25. An electric motorcycle, comprising:

the thermal management system according to claim 1, and/or a thermal management module, wherein the thermal management module comprises:

a housing;

a motor tube, wherein the motor tube is in fluid connection with a motor of the electric motorcycle and comprising a first fluid for cooling and/or heating the motor;

a battery tube, wherein the battery tube is in fluid connection with a battery of the electric motorcycle and comprising a second fluid for cooling and/or heating the battery; and an electrical line configured to realize an electrical connection of the thermal management module;

wherein the motor tube, the battery tube and the electrical line are located in the housing.

26. The electric motorcycle according to claim 25, wherein the electric motorcycle is an all-electric motorcycle.

* * * * *